(12) United States Patent
Waarts et al.

(10) Patent No.: US 6,996,140 B2
(45) Date of Patent: Feb. 7, 2006

(54) LASER DEVICE FOR NONLINEAR CONVERSION OF LIGHT

(75) Inventors: Robert G. Waarts, Los Altos, CA (US); Nigel Copner, Gwent (GB)

(73) Assignee: JDS Uniphase Corporation, San Jose, CA (US)

( * ) Notice: Subject to any disclaimer, the term of this patent is extended or adjusted under 35 U.S.C. 154(b) by 240 days.

(21) Appl. No.: 10/742,959

(22) Filed: Dec. 22, 2003

(65) Prior Publication Data

US 2004/0131093 A1    Jul. 8, 2004

Related U.S. Application Data

(60) Provisional application No. 60/436,246, filed on Dec. 23, 2002.

(51) Int. Cl.
H01S 3/10    (2006.01)
H01S 3/04    (2006.01)

(52) U.S. Cl. .................. 372/21; 372/22; 372/43.01
(58) Field of Classification Search .......... 372/22, 372/21
See application file for complete search history.

(56) References Cited

U.S. PATENT DOCUMENTS

| | | | |
|---|---|---|---|
| 4,953,166 A * | 8/1990 | Mooradian | 372/21 |
| 5,185,752 A | 2/1993 | Welch et al. | 372/22 |
| 5,237,578 A * | 8/1993 | Amano | 372/22 |
| 5,485,481 A | 1/1996 | Ventrudo et al. | 372/6 |
| RE35,215 E | 4/1996 | Waarts et al. | 372/108 |
| 5,544,271 A | 8/1996 | Lim | 385/122 |
| 5,644,584 A | 7/1997 | Nam et al. | 372/20 |
| 5,724,377 A * | 3/1998 | Huang | 372/98 |
| 2002/0154663 A1 * | 10/2002 | Zhu et al. | 372/22 |
| 2004/0165639 A1 * | 8/2004 | Lang et al. | 372/92 |

OTHER PUBLICATIONS

"Applied Nonlinear Optics" by F Zernike and J.E Midwinter, Wiley Science 1973, pp. 108-111.
"Compact Blue Green Lasers" Risk et al., Cambridge University Press 2003. Section 2.2.6; pp. 34-39.

* cited by examiner

*Primary Examiner*—Zandra Smith
*Assistant Examiner*—Marcia Golub
(74) *Attorney, Agent, or Firm*—Allen, Dyer, Doppelt, Milbrath & Gilchrist, P.A.

(57) ABSTRACT

A laser apparatus for nonlinear conversion of light is disclosed utilizing a laser diode having a reflective back facet and a front facet having a reflectance of less than about 1% for emitting a multifrequency optical beam, and a nonlinear optical element for receiving the multifrequency optical beam and for generating a frequency-converted radiation. An external frequency-selective reflector is provided for power and spectral stabilization of the multifrequency optical beam, and for confining its optical spectrum within a bandwidth of efficient nonlinear conversion in the nonlinear optical element. The laser diode reflective back facet and the external frequency-selective reflector form an extended laser cavity. In operation, the multifrequency optical beam contains a plurality of longitudinal modes of the extended laser cavity which are confined within the frequency conversion bandwidth of the nonlinear element. The external frequency-selective reflector may comprise a waveguiding element such as a single-mode fiber incorporating a Bragg grating, and may also comprise a Fabry-Perot etalon.

20 Claims, 6 Drawing Sheets

LASER DEVICE FOR NONLINEAR CONVERSION OF LIGHT

This application claims priority of U.S. provisional Patent Application No: 60/436,246 filed Dec. 23, 2002 entitled "Novel Multimode Source Suitable for Efficient Frequency Doubling", which is incorporated herein by reference for all purposes.

FIELD OF THE INVENTION

The present invention relates to sources of short wavelength radiation employing nonlinear frequency conversion of laser diode radiation.

BACKGROUND OF THE INVENTION

There is considerable demand for short-wavelength laser sources such as green, blue and UV lasers. One known approach to create such a light source is to utilize red or infra-red laser diodes, which are widely available in a variety of configurations. These diodes, in combination with nonlinear elements made of optically nonlinear materials, can produce short-wavelength frequency-doubled radiation by means of nonlinear frequency conversion such as second harmonic generation (SHG) in a nonlinear optical element.

In frequency converting laser devices such as frequency doubling devices a beam of light of a narrow wavelength range, commonly referred to as a fundamental beam having a fundamental frequency, illuminates a nonlinear crystal which doubles the output frequency of the light. The input light beam can be typically in an infrared region and the output light will be in the visible portion of the spectrum. For example, if a 980 nm laser wavelength light is passed through a nonlinear crystal such as $LiTaO_3$ blue light with wavelength of 490 nm will be output.

For efficient frequency conversion, the fundamental frequency beam and the frequency-converted beam have to propagate through nonlinear material with the same phase velocity, a requirement commonly referred to as a phase matching condition. Refractive index of most materials though is wavelength dependent, which makes phase matching of the fundamental and frequency-converted beams difficult. Various methods are used to satisfy the phase matching condition. These methods include passing light through a nonlinear crystal at a specific angle or passing the light through a so called periodically poled (PP) nonlinear crystal, i.e. a crystal with periodically arranged ferroelectric domains of inverted polarity. In such cases the specific angle used for passing light through the crystal or the period of the inverted polarity zones determines a specific wavelength range of the incident light that can be phase matched.

In general, the phase matching wavelength has to be very precise, and small deviations from the optimum value can cause significant loss of frequency conversion efficiency. Typically, the wavelength of the laser has to stay within ~0.1 nm to 0.02 nm from the optimum phase matching wavelength. This requirement puts a stringent condition on input laser sources for frequency doubled light, typically requiring the use of frequency-selective elements such as gratings to narrow and stabilize the frequency range of laser radiation.

A number of prior art solutions for frequency conversion and frequency doubling of laser diode emission utilizing frequency selective elements have been disclosed. For example, U.S. Pat. No. 5,185,752, in the names of Welch et al., describes arrangements for efficiently coupling light between a laser diode and a second-harmonic generator which feature external resonant cavities that include a feedback grating fabricated on the second-harmonic generator. U.S. Pat. No. 5,644,584, in the names of Nam, et al. describes a tunable blue laser diode having a distributed Bragg reflector (DBR) or distributed feedback (DFB) tunable diode laser coupled to a quasi-phase-matched waveguide of optically nonlinear material. In U.S. Pat. No. RE35,215, Waarts et al. describe a semiconductor laser light source which employs a Littman grating coupled to a back facet, providing short wavelength light by means of frequency doubling of red or infrared light from a high power flared resonator type laser diode, or a MOPA (master oscillator power amplifier) type laser diode.

These inventions provide solutions wherein power and frequency stabilization requirements are met through the use of complex laser structures or complex nonlinear element arrangements. An alternative approach is to use high power semi-conductor lasers of simple cavity design, such as edge emitting 980 nm laser diodes commonly used to pump erbium-doped fiber amplifiers, in an extended cavity arrangement with frequency stabilization provided by an external frequency selective reflector such as a fiber Bragg grating (FBG). These commercially available inexpensive single spatial mode semiconductor chips have an antireflection coated front facet, and can generate over 1 watt of power in continuous operation, provided that optical feedback from the FBG into the laser diode is optimized, typically at a feedback level when about 3% of the laser radiation is returned back into the laser diode. U.S. Pat. No. 5,544,271 to Lim describes a nonlinear optical generator of such a type which includes a semiconductor laser diode with an anti-reflection coated facet, an optical fiber with a fiber Bragg grating incorporated in it and a nonlinear material for nonlinear frequency conversion.

Although the aforementioned inventions appear to perform their intended functions, they provide solutions wherein the laser sources operate in a single-frequency regime, with lasing on a single longitudinal mode of the laser cavity. Single frequency single mode lasing however is known to exhibit spectral and power instabilities and mode hops due to aging, changes in temperature, pump current etc. Contrary to single frequency operation, a multi-frequency laser having several longitudinal modes present in its optical spectrum is known to provide more stable output and to allow avoiding mode hops and other instabilities associated with changing lasing conditions.

Several prior art solutions that use multiple longitudinal mode multifrequency operation of laser diodes with external fiber Bragg grating reflectors for spectral and/or power stabilization of their output have been proposed. U.S. Pat. No. 5,485,481 to Ventrudo et al. describes an FBG-stabilized multifrequency laser wherein an optical feedback provided by the FBG is small compared to a feedback provided by reflections from an output facet of the laser diode, resulting in a so-called coherence collapse regime of laser operation, when the laser diode is forced into a state of chaotic but stable wide-band multifrequency lasing. High-power FBG-stabilized lasers of this type based on 980 nm laser diodes operating in a multifrequency coherence collapse regime are commercially available. However, the coherence collapse regime of operation together with a substantially broadband reflection spectrum of the FBG used in 980 nm pump lasers results in a broad laser linewidth of the order of 0.3–1 nm, far exceeding typical linewidth requirements of ~0.02–0.1 nm or less for efficient SHG in periodically-poled nonlinear materials. Therefore, although the multifrequency operation of such high-power FBG-stabilized lasers does provide more stable output, this solution may be less efficient for the purpose of nonlinear frequency conversion.

U.S. Pat. No. 5,724,377 to Huang describes a method of reducing power fluctuations for an FBG-stabilized laser diode caused by mode hops due to variations in laser current by using an FBG which reflection bandwidth is 2 to 4 times bigger than a longitudinal mode spacing of the laser diode. This method, however, does not necessarily ensure multifrequency operation of a laser diode and hence does not provide spectral stabilization required for stable frequency conversion.

Suppression of spectral, as well as power, instabilities of a laser output provided by multifrequency lasing can be of especial importance when this output is used for nonlinear frequency conversion. Power and spectral instabilities such as mode hops can be transformed with amplification into power instabilities of the frequency converted light due to a quadratic dependence of the converted light power on the optical power of the input fundamental radiation and due to the aforementioned strong spectral dependence of the frequency conversion efficiency on the fundamental wavelength in periodically poled nonlinear elements.

The use of multifrequency operation has another important advantage for nonlinear frequency conversion which has been generally overlooked in the prior-art solutions for sources of frequency converted radiation. Namely, using a source of fundamental laser radiation having multiple longitudinal modes in it spectrum allows achieving higher nonlinear conversion efficiency. Indeed, the conversion efficiency has been found to depend on the number of longitudinal modes N which are present in the optical spectrum of the laser radiation, as follows: $E_{ff}(N)=Eff(1)*k(N)$, where a factor $k(N)=(2-1/N)$, and $E_{ff}(1)$ is a single-mode conversion efficiency. More details are given, for example, by Risk et al. in Section 2.2.6 of a book entitled *Compact Blue Green Lasers*, Cambridge University Press, 2003, and by Zernike and Midwinter, in *Applied Nonlinear Optics*, John Wiley and Sons, 1973. For a large number of modes the efficiency of nonlinear frequency conversion is therefore twice as high as for a single mode case, and approximately 50% higher in a two-mode case, which translates into up to two times higher power of frequency converted light for the same input power of the fundamental radiation.

An object of this invention is to provide a multifrequency external cavity laser diode arrangement for generation of short-wavelength radiation through nonlinear frequency conversion such as frequency doubling, which is capable of achieving stable high power operation using simple, low cost optics and assembly.

SUMMARY OF THE INVENTION

In accordance with the invention, a laser apparatus for nonlinear frequency conversion of light is provided comprising a semiconductor laser diode having a reflective back facet and a front facet with a reflection coefficient of less than 1% for emitting multifrequency laser radiation in multiple longitudinal modes and an essentially single spatial mode along an optical path, a partially reflecting filter having a reflection bandwidth b disposed to receive the multifrequency laser radiation from the front facet and to reflect a first portion of the laser radiation of bandwidth b towards the front facet, for confining the operation of the semiconductor laser diode within said bandwidth b and for transmitting a second portion of the multifrequency laser radiation along the optical path, a nonlinear optical element having nonlinear optical conversion bandwidth c disposed to receive the second portion of the multifrequency laser radiation for nonlinear frequency conversion of the multifrequency laser radiation and for producing a frequency-converted multifrequency radiation, wherein said partially reflecting filter and the back facet of the semiconductor laser diode form a cavity having a longitudinal mode spacing a, wherein the reflection bandwidth b is smaller than 3 c and the mode spacing a is substantially smaller than the nonlinear optical conversion bandwidth c and the reflection bandwidth b, for enabling nonlinear frequency conversion of a plurality of longitudinal modes of the extended cavity.

In accordance with another aspect of this invention, the partially reflecting filter, while in operation, reflects between 1% and 20% of the laser diode radiation back into the laser diode.

In accordance with another aspect of this invention, the partially reflecting filter comprises a Bragg grating formed in a waveguiding optical element capable of guiding the multifrequency laser radiation. In one embodiment, the Bragg grating has a reflection bandwidth equal to the reflection bandwidth b. In another embodiment, the partially reflecting filter further comprises a Fabry Perot etalon disposed between the multifrequency laser diode and the Bragg grating and optically aligned with said laser diode and said Bragg grating for confining the multifrequency laser radiation within the reflection bandwidth b, and wherein the reflection bandwidth of the Bragg grating is greater than a transmission bandwidth of the Fabry Perot etalon but smaller than an FSR of said etalon.

In a preferred embodiment the waveguiding optical element is a polarization-maintaining single-mode optical fiber.

In accordance with another aspect of the invention, the partially reflecting filter comprises a collimating means disposed to receive the multifrequency laser radiation for at least partially collimating said radiation into an at least partially collimated multifrequency beam propagating along the optical path, and a bulk transmission grating disposed to receive the at least partially collimated multifrequency beam and to return a first portion of the laser beam of the bandwidth b towards the front facet of the multifrequency laser diode.

BRIEF DESCRIPTION OF THE DRAWINGS

Exemplary embodiments of the invention will now be described in conjunction with the drawings in which.

DETAILED DESCRIPTION OF THE PREFERRED EMBODIMENT

Figure 1:
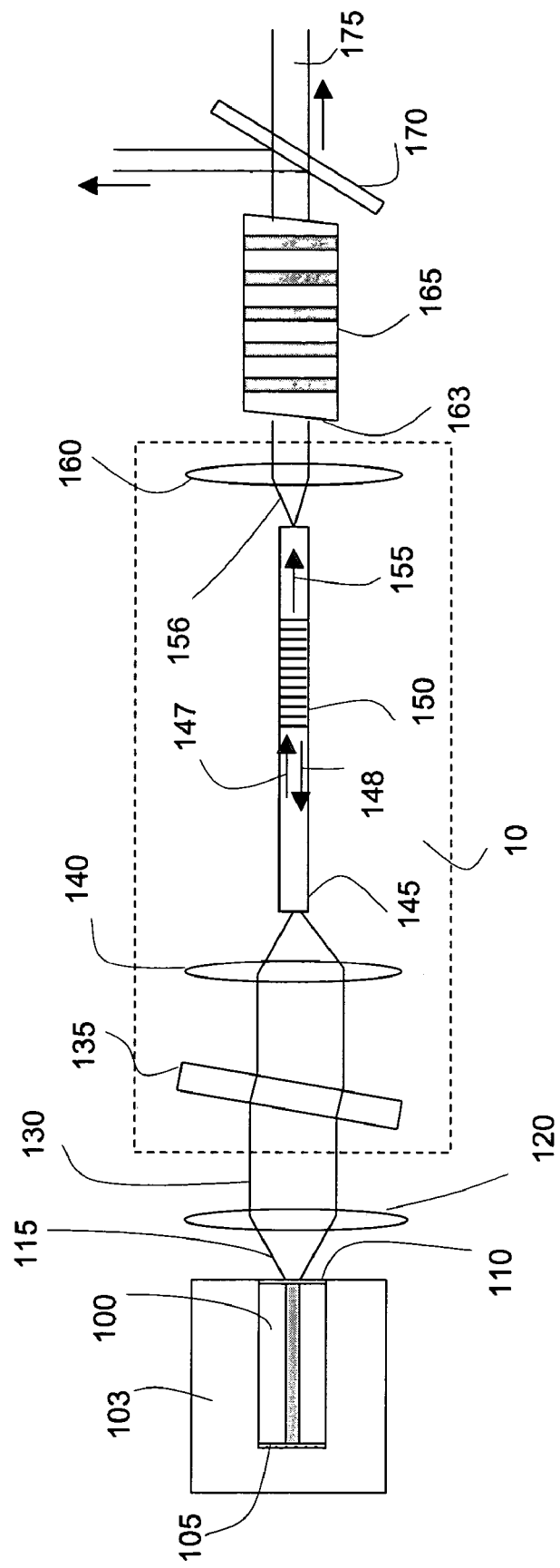
FIG. 1 is a diagram of a multifrequency laser apparatus for nonlinear conversion of light comprising a Fabry-Perot etalon and a waveguiding optical element incorporating a Bragg grating.

A preferred embodiment of a multifrequency laser device for nonlinear frequency conversion of light is shown in FIG. 1 and is hereafter described.

A semiconductor laser diode chip 100 mounted on a carrier 103 has a high-reflection coated back facet 105 and an anti-reflection coated front facet 110 having a reflectivity of less than 1%. The laser diode is capable of emitting a multifrequency high power light beam 115 in a single spatial mode having a central optical frequency $f_c$ in the red or near-infrared region of the optical spectrum. The laser diode is optically coupled through a collimating means 120, a Fabry-Perot etalon 135, and a focusing means 140 to a waveguiding element 145. The waveguiding element 145 incorporates a Bragg grating 150 having a reflection bandwidth d for reflecting back a portion of the laser beam within the frequency bandwidth d around the central optical frequency $f_c$. The Bragg grating 150 and the back facet 105 of the laser diode 100 form an extended cavity (EC) having a longitudinal mode spacing a=C/2L, where C is the speed of light, and L is an optical length of the extended cavity.

The collimating means 120 can be a collimating lens or a system of collimating lenses, and can include an anamorphic lens or a system of lenses with anamorphic properties. An anamorphic lens such as a cylindrical lens is typically required when a semiconductor laser diode produces an asymmetric and astigmatic laser beam due to asymmetry of the lateral and transverse directions of a laser diode waveguide. The laser diode beam can be made symmetrical and its astigmatism can be significantly reduced when a cylindrical lens or more generally an anamorphic lens is disposed close to the laser facet 110. Very efficient fiber coupling up to 85% or more can be obtained by forming a small lens at the tip of the fiber through polishing or melting of the fiber.

The Fabry-Perot etalon 135 is positioned in an optical path of the beam 130 at an angle to the direction of the beam propagation to avoid back reflection of light into the laser diode, and to pass a portion of the beam 130 within a transmission bandwidth of the etalon along the optical path.

Figure 2:
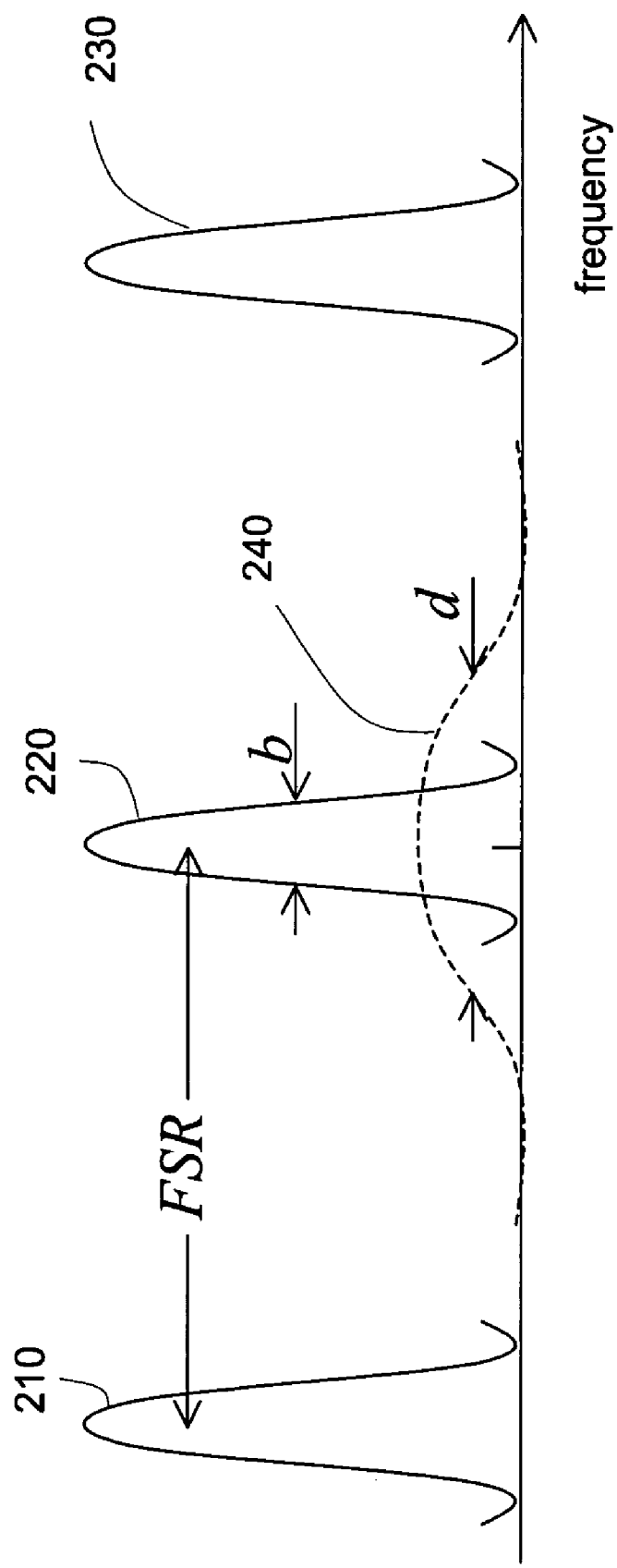
FIG. 2 is a schematic diagram of a transmission function of the Fabry-Perot etalon.

With reference to FIG. 2, a transmission spectrum of the Fabry-Perot etalon has multiple transmission peaks 210, 220 and 230 of spectral width b spaced by a constant frequency interval commonly referred to as a free spectral range (FSR). The FSR of the Fabry-Perot etalon exceeds the width d of the reflection band 240 of the Bragg grating 150, while the spectral width b of the transmission peaks of the Fabry-Perot etalon is typically less than d:

$$FSR > d > b \quad (1)$$

One of the transmission peaks marked in FIG. 2 with a numeral "220" having its maximum at an optical frequency $f_e$ lies within the reflection band 240 of the Brag grating, while neighboring transmission peaks 210 and 230 of said etalon are outside of said reflection band. With reference to FIG. 1, the Fabry-Perot etalon 135 and the Brag grating 150 together comprise a frequency-selective external reflector 10 having a reflective bandwidth approximately equal to the transmission bandwidth b of the Fabry-Perot etalon, and a maximum reflectivity $R_{eff} \approx (\eta T)^2 R_{bragg}$, where $\eta 0$ is a laser diode—Bragg grating coupling efficiency, T is a transmission coefficient of the Fabry-Perot etalon, and $R_{bragg}$ is the Bragg grating reflectivity. Typically, the etalon transmission coefficient T and the coupling coefficient $\eta$ are between 50% and 90%, and the Bragg grating reflectivity $R_{bragg}$ can be between 2% and 20%, so that the reflectivity of the frequency selective reflector is in a range of 1% to 20%.

This frequency selective reflector 10 reduces optical loss of laser radiation within the frequency bandwidth b by returning part of the radiation back into the laser diode 100, thereby confining the laser radiation to EC modes within the frequency bandwidth b. Reflection from the AR coated front facet 110 is small compared to $R_{eff}$ and do not substantially affect the laser operation, provided that $f_e$ is positioned no too far from an optical gain peak of the laser diode, typically within approximately 30 nm; allowable offset of $f_e$ from the gain peak can however depend on the material system and waveguide design of the laser diode. Optical spectrum of the laser radiation is therefore centered near the optical frequency $f_e$ and is confined to extended cavity modes within a spectral bandwidth which is typically less than b. Note that within the specification the meaning of "within the bandwidth b" shall be "within the bandwidth b or within a bandwidth less than bandwidth b". The central frequency $f_e$ of the EC laser spectrum is approximately equal to the optical frequency $f_e$ of the maximum etalon transmission, and can be tuned within the reflection bandwidth of the Bragg grating by changing angular orientation of the Fabry-Perot etalon. The length of the extended cavity L satisfies a condition $$L >> 2C/(n\,b) \quad (2)$$

in order for a plurality of EC modes to exist within the transmission bandwidth of the Fabry-Perot etalon, and to enable multifrequency lasing. In (2), C is the speed of light, and n is an average effective refractive index of the extended cavity.

A substantial portion, typically between 80% and 95%, of the laser diode beam 130 coupled into the waveguiding element 145 is transmitted through the Bragg grating and exits said waveguiding element to form an external cavity laser (ECL) beam 156. Due to the aforementioned condition (2), the EC mode spacing a is small with respect to the transmission bandwidth b of the Fabry-Perot etalon, and the ECL beam is a multifrequency beam containing a plurality of the EC longitudinal modes. A nonlinear optical element 165 having a frequency bandwidth of nonlinear conversion c is positioned to receive said ECL beam. The nonlinear optical element 165 is capable of generating a frequency converted light beam 175 having a wavelength or a set of wavelength in the ultraviolet, blue or green range of the spectrum from a portion of the optical power of the ECL beam 156, provided that said portion of the optical power of the ECL beam 156 is contained within the nonlinear conversion bandwidth c of the nonlinear element 165. The frequency converted light beam 175 has a wavelength or a set of wavelengths which is different from that of the ECL beam 156.

A dichroic filter 170 may be placed at the output of nonlinear element 165 to block the ECL beam and to pass the frequency-converted beam as the output of the laser apparatus. Additional collimating or collimating and focusing means 160 can be disposed between the waveguiding element 145 and the nonlinear element 165 for collimating or collimating and focusing the laser beam 156. The front facet 163 of the nonlinear element 165 facing the waveguiding element 145 can be antireflection coated and/or slightly angled to prevent back reflections of the laser radiation into the laser diode cavity.

In the preferred embodiment, the nonlinear optical element 165 is a periodically poled nonlinear crystal capable of generating a frequency doubled radiation from a portion of the optical power of the ECL beam by means of second harmonic generation (SHG). Periodical poling of a nonlinear crystal is generally used to provide a high efficiency SHG for an input fundamental wave having an optical frequency equal or close to a phase-matching frequency $f_{match}$ by equalizing average phase velocities of a fundamental optical wave and its second harmonic. Said equalizing is achieved by creating alternating ferroelectric domains of opposite polarization designed in such a way that optical phase mismatches between the fundamental wave of frequency $f_{match}$ and its second harmonic accumulated during propagation through two consecutive ferroelectric domains exactly compensate each other, whereby enabling nonlinear conversion of the fundamental wave into the frequency doubled wave during propagation throughout the entire length of the nonlinear crystal. The phase matching condition however breaks down when the fundamental optical frequency is tuned away from $f_{match}$, yielding increasing phase mismatch between the fundamental and the frequency-doubled waves as they propagate along the nonlinear crystal, whereby limiting the distance of efficient nonlinear interaction between said waves and reducing efficiency of the frequency conversion and frequency doubling. Optical band of the nonlinear frequency conversion in periodically poled nonlinear elements is therefore rather narrow. For example, periodically poled $LiNbO_3$ waveguides with 7–10 mm length have typically a maximum nonlinear conversion efficiency of 200–800%-Watt/$cm^2$, depending on design, and the nonlinear conversion bandwidth c~0.1 nm. In the context of present invention, the phase matching frequency $f_{match}$ of the periodically poled nonlinear element 165 is positioned within the reflection band of the Bragg grating so that $f_e=f_{match}$, which can be achieved for example by adjusting the angular orientation of the Fabry-Perot etalon.

According to the invention, the ECL beam 156 is a multifrequency beam having a plurality of longitudinal modes of the extended cavity within the nonlinear frequency conversion bandwidth c of the nonlinear element, whereby enabling an improved nonlinear conversion efficiency and a better power stability of the frequency-converted radiation.

Having a large number modes in the ECL beam which are tightly spaced within the nonlinear conversion bandwidth c enables improving power stability of the frequency converted radiation compared to a single-mode case or a case when only 2 or 3 modes can fit within the bandwidth c. First, it allows avoiding sudden mode hops often associated with single-mode lasing. Second, power fluctuations between modes of a multimode radiation are less likely to cause power fluctuations of the frequency converted radiation because each mode has only a small portion of the total optical power. Moreover if the spectral variations associated with the power fluctuations of individual modes are random they will tend to average out when the number of modes is large. In contrast, if a fundamental wave has for example only 2–3 modes fitting within the bandwidth of nonlinear conversion, power fluctuations between them could affect the frequency converted output significantly because of a somewhat different conversion efficiency for each mode, and because the optical power in each mode would be a substantial part of the total power.

Figure 3B:
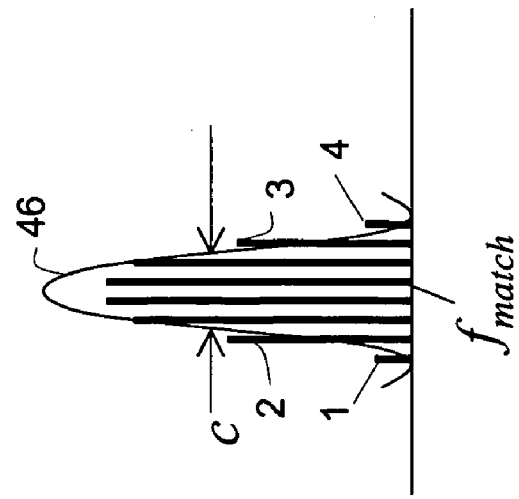
FIG. 3B is a schematic diagram showing a multifrequency laser spectrum which is wider than the frequency band of nonlinear frequency conversion.
Figure 3A:
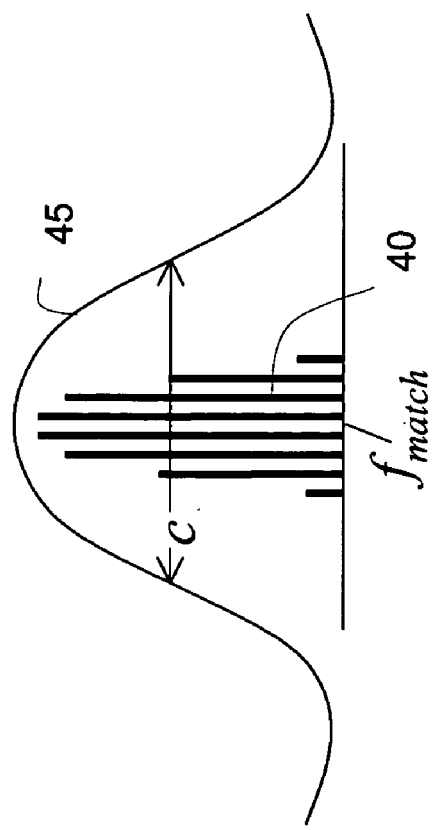
FIG. 3A is a schematic diagram showing a multifrequency laser spectrum which is narrower than the frequency band of nonlinear frequency conversion.

The efficiency of nonlinear frequency conversion of the multimode multifrequency laser radiation is improved compared to a single-frequency radiation of the same optical power by the aforementioned factor $k(N)\approx(2-1/N)$, where N is an effective number of modes in said radiation. For example, if N=10, the efficiency can be increased by up to 90%. To fully realize this improvement, the plurality of the EC modes present in the ECL beam should be confined within a narrow frequency region of bandwidth b'<c near the peak frequency $f_{match}$ of the nonlinear conversion efficiency. This case is illustrated in FIG. 3A, which schematically shows a multifrequency spectrum 40 of the ECL beam centered near the peak of the nonlinear conversion efficiency spectrum 45. In this case, nearly maximum improvement of the conversion efficiency as given by the aforementioned multifrequency factor k(N) is possible. FIG. 4B illustrates another possible case wherein the spectral width b' of the multifrequency spectrum of the ECL beam is slightly wider than the nonlinear conversion efficiency spectrum 46. In this case, spectral peaks 1, 2, 3 and 4 representing outer modes of the multifrequency laser spectrum are positioned outside of the frequency band of efficient frequency conversion, therefore providing little contribution to the frequency converted radiation.

Reflectivity $R_{ac}$ of the front facet of the laser diode in the wavelength range of it operation is less than ~1% and substantially smaller than the reflectivity of the external frequency-selective reflector $R_{eff}$ in order to avoid undesirable coupled-cavity effects. In a preferred configuration, $R_{ac}$ should be less than ~1–0.05%, while $R_{eff}$ is within ~2–%10%. Under these conditions, cavity losses of the EC modes are then determined mainly by a reflection spectrum of the external frequency-selective reflector, or in this embodiment, by the transmission characteristics of the Fabry-Perot etalon. Those skilled in the art will appreciate that even relatively small cavity loss variations from one mode to another can lead to strong mode discrimination in laser spectrum. Therefore, the optical spectrum of the ECL beam will normally be narrower than the reflection spectrum of the external reflector.

Figure 4A:
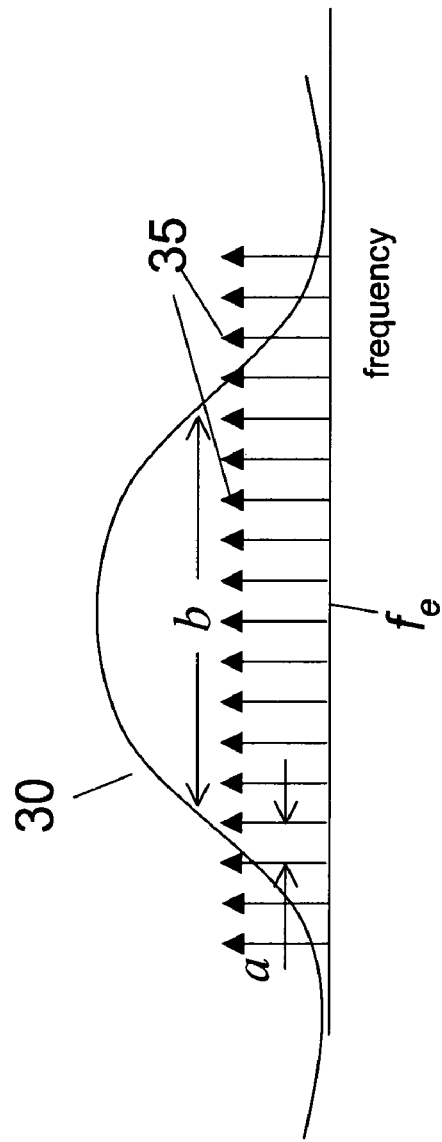
FIG. 4A is a schematic diagram showing a reflection spectrum of the external frequency-selective reflector and the EC mode positions.
Figure 4B:
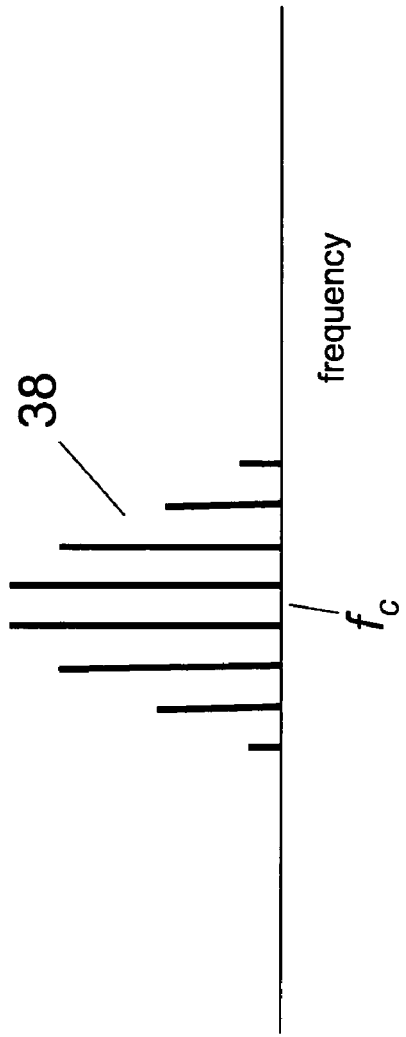
FIG. 4B is a schematic diagram showing a multifrequency optical spectrum containing multiple EC modes.

With reference to FIG.4A, the reflection spectrum 30 of the external frequency-selective reflector 10 has a bandwidth b which is much wider than the spacing a between the EC modes 35. EC modes closest to the central frequency $f_e$ of the reflection spectrum 30 experience maximum reflection and therefore minimum cavity loss. On the other hand, EC modes positioned closer to the edge of the reflection spectrum 30, experience considerably smaller reflection and therefore stronger optical loss. This results in a multifrequency optical spectrum 38 shown in FIG. 4B, which is narrower than the reflection spectrum 30.

In the preferred embodiment the frequency bandwidth b of the external reflector is selected to be less than approximately 3 c. We have discovered that this restriction is suitable for efficient frequency conversion in a laser apparatus according to present invention. The extended cavity length L should be long enough to enable a plurality of longitudinal modes of the external cavity to exist within the frequency conversion bandwidth c of the nonlinear element 165. For example, if c~0.1 nm, b can be ~0.2–0.02 nm to ensure that most of the lasing EC modes are contained within the frequency region of the most efficient frequency conversion; the EC length should be approximately 15 cm or longer, corresponding to the EC mode spacing of approximately 0.003 nm or less, whereby providing for at least 7 or more EC modes within the frequency band of the nonlinear conversion.

In the preferred configuration, the waveguiding element 145 is a polarization-maintaining single-mode fiber, and the Bragg grating 150 is a fiber Bragg grating (FBG) that is typically formed by exposing a photosensitive core of the optical fiber to a high intensity radiation pattern using techniques which are well established in the prior art. The polarization maintaining property of the fiber is required since laser diode operation is sensitive to polarization state of the back reflected beam, which therefore needs to be maintained constant in order to reduce laser instabilities. Note that the use of optical fiber allows the EC length L to be as high as tens or even hundreds of meters; however practical considerations such as packaging size and cost will likely limit it to a few meters or less.

In other embodiments, the waveguiding element 145 can be a silicon-based planar optical waveguide or a polymer-based planar optical waveguide, and the Bragg grating 150 can be either etched lithographically or formed by exposing the waveguide to a high intensity radiation pattern using techniques which are well established in the prior art.

In the preferred configuration, the laser diode chip 100 is a GaAs/InGaAs semiconductor heterostructure chip of type employed in commercial high-power 980 nm lasers commonly used for optical pumping of erbium-doped fiber amplifiers (EDFA). The high-power 980 nm laser chips are commercially available and are relatively inexpensive. A laser diode chip of this type has a high-reflectivity back facet and a front facet with reflectivity of about several percent. These laser chips, when coupled to a fiber Bragg grating (FBG) which retro-reflects a small portion of the diode radiation back into the laser diode to provide an optimal output reflectivity of ~3%, are cable of producing in excess of 1W of stabilized laser radiation at a fundamental wavelength of 980 nm. By using a laser diode chip of this type in the aforedescribed configuration shown in FIG. 1 with an anti-reflection coated front facet, it is possible to generate multifrequency laser radiation at the fundamental frequency corresponding to the fundamental wavelength of 980 nm with the linewidth less than 0.1 nm, as is required for efficient frequency doubling in the nonlinear element. To ensure high lasing efficiency, the transmission grating has to retro-reflect back into the laser chip the optimal portion of the diode radiation, 1–5% typically.

In other embodiments of the present invention, the laser diode chip 100 can be a semiconductor laser chip of any known type capable of generating optical power in excess of 0.1–1 W in a single spatial mode. Semiconductor laser chips incorporating GaN, InP, and GaAs based heterostructures can produce radiation with wavelength from 350 nm–over 1600 nm. Frequency doubling of its light in accordance with the present invention will yield IR laser radiation with wavelength of 175–to over 800 nm, with the short-wavelength part of this spectral interval corresponding to UV, blue and green light being of the most practical interest for frequency doubling approach.

Figure 5:
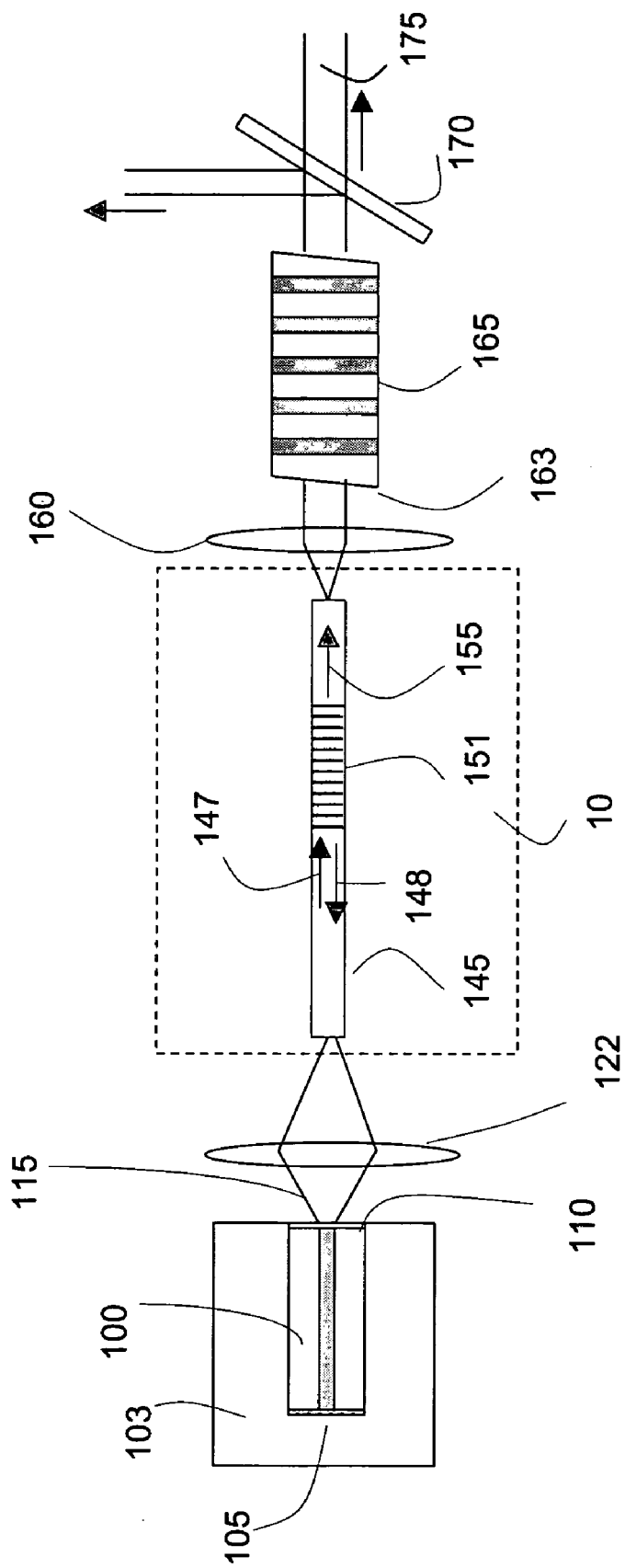
FIG. 5 is a diagram of a multifrequency laser apparatus for nonlinear conversion of light comprising a waveguiding optical element incorporating a Bragg grating.

With reference to FIG. 5, another embodiment of present invention comprises a waveguiding element 145 incorporating a narrow-band Bragg grating 150 as the frequency-selective external reflector 10, without any additional intra-cavity frequency-selective optical elements. Similar to the aforedescribed preferred embodiment, in this embodiment the laser diode 100 having a high-reflection coated back facet 105 and an anti-reflection coated front facet 110 with a reflectivity of less than 1%, is capable of emitting the multifrequency high power light beam 115 in a single spatial mode. Said laser diode is optically coupled through a focusing means 122 to the waveguiding element 145 incorporating the Bragg grating 151. The Bragg grating 151 together with the back facet 105 of the laser diode 100 form an extended cavity having a longitudinal mode spacing a.

In this embodiment, the Bragg grating 151 has a reflection bandwidth b less than 3 c, and preferably, less than c, but much larger than the external cavity mode spacing a. Typically, if the nonlinear conversion bandwidth c~0.1 nm, the reflection bandwidth of the Bragg grating b can be between 0.2 nm and 0.02 nm, and the external cavity length L should be at least 10–15 cm. The waveguiding element 145 can be a single-mode polarization-maintaining optical fiber. In this case, the laser diode 100, the focusing means 122 and the optical fiber 145 can be assembled as a pigtailed laser diode using well-developed commercial assembly techniques. In such an assembly, the length of the extended cavity can be easily increased by positioning the Bragg grating further away from a fiber end facing the laser diode.

Figure 6:
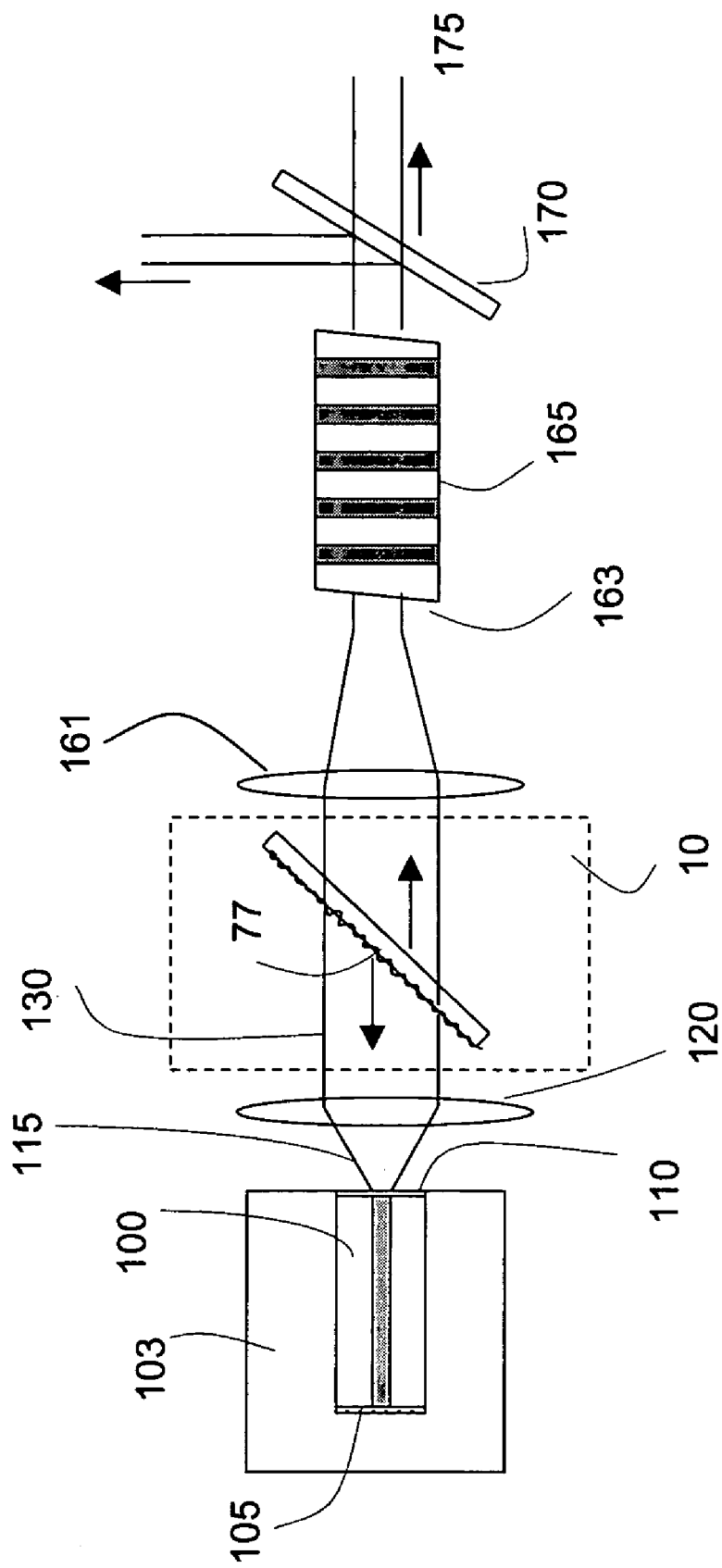
FIG. 6 is a diagram of a multifrequency laser apparatus for nonlinear conversion of light comprising a bulk transmission grating.

With reference to FIG. 6, yet another embodiment of present invention comprises a bulk transmission grating 77 as a frequency-selective external reflector. The extended laser cavity having the longitudinal mode spacing a is formed by the grating 77 and the back facet 105 of the laser diode 100. The laser diode 100 having a high-reflection coated back facet 105 and an anti-reflection coated front facet 110 with a reflectivity of less than 1% is capable of emitting the multifrequency high power light beam 115 in the red or near-infrared region of the optical spectrum. The laser diode is optically coupled through a collimating means 120 to a bulk diffraction grating 77 oriented to diffract a portion of the laser beam back into the laser diode to provide optical feedback. The collimating means 120 is shown to be a single lens but alternatively can be a collimating lens or more typically a system of collimating lenses. A portion of the laser beam 130, which is at least partially collimated by the collimating means 120, passes through the transmission grating 77 forming the ECL beam, which is further coupled to the nonlinear element 165. Additional collimating or collimating and focusing means 161 can be disposed between the bulk grating 77 and the nonlinear element 165 for collimating or collimating and focusing the ECL beam.

The transmission grating 77 can be either a surface relief grating having a periodically corrugated surface etched or drawn in a transparent material such as glass, or a holographic grating optically written in a photo-sensitive material supported by a substrate. In both cases, to suppress specular reflections from the back surface of the gratings, an anti-reflection coating can be applied to the back surface. An antireflection coating can also be applied to the front surface of a holographic grating.

The configurations shown in FIGS. 1, 5 and 6 are single-pass conversion configurations in which the nonlinear element is a periodically-poled bulk crystal of nonlinear optical material. The spot size of the beam 156 in the crystal is optimized for maximum single pass conversion efficiency by focusing the beam to the smallest possible spot size such that the beam still remains focused over the length of the crystal. Alternatively, the nonlinear element can be a periodically-poled nonlinear waveguide produced for example by doping of a nonlinear crystalline material as known to those skilled in the art, such as periodically-poled $LiNbO_3$ waveguide. The nonlinear crystalline material may also be potassium titanophosphate ($KTiOPO_4$), potassium niobate ($KNbO_3$), barium metaborate ($BaB_2O_4$), lithium triborate (LiB$_3$O$_5$), neodymium yttrium aluminum borate ($Nd_xY_{1-x}Al_3$)$BO_{34}$, as well as various organic nonlinear optical materials.

What is claimed is:

1. A laser apparatus for nonlinear frequency conversion of light comprising:
   a) a semiconductor laser diode having a reflective back facet and a front facet with a reflection coefficient of less than about 1% for emitting multifrequency laser radiation in multiple longitudinal modes and an essentially single spatial mode along an optical path;
   b) a partially reflecting filter having a reflection bandwidth b disposed to receive the multifrequency laser radiation from the front facet and to reflect a first portion of the multifrequency laser radiation of bandwidth b towards the front facet, for confining the operation of the semiconductor laser diode within said bandwidth b and for transmitting a second portion of the multifrequency laser radiation along the optical path;
   c) a nonlinear optical element having nonlinear optical conversion bandwidth c disposed to receive the second portion of the multifrequency laser radiation for nonlinear frequency conversion of the multifrequency laser radiation and for producing a frequency-converted multifrequency radiation;
   wherein said partially reflecting filter and the back facet of the semiconductor laser diode form a cavity having a longitudinal mode spacing a, wherein the reflection bandwidth b is smaller than 3c and the longitudinal mode spacing a is substantially smaller than the nonlinear optical conversion bandwidth c and the reflection bandwidth b, for enabling nonlinear frequency conversion of a plurality of longitudinal modes of the extended cavity.

2. The laser apparatus as defined in claim 1, wherein the partially reflecting filter has a reflectivity between 1% and 20%.

3. The laser apparatus as defined in claim 1, wherein the partially reflecting filter comprises a Bragg grating formed in a waveguiding optical element capable of guiding the multifrequency laser radiation.

4. The laser apparatus as defined in claim 3, wherein the waveguiding optical element is a single-mode optical fiber.

5. The laser apparatus as defined in claim 4, wherein the single-mode optical fiber is a polarization-maintaining single-mode optical fiber.

6. The laser apparatus as defined in claim 3, wherein the Bragg grating has a reflection bandwidth equal to the reflection bandwidth b.

7. The laser apparatus as defined in claim 6, further comprising coupling means for coupling the multifrequency laser radiation into the waveguiding optical element.

8. The laser apparatus as defined in claim 3, further comprising coupling means for coupling the second portion of the multifrequency laser radiation into the nonlinear optical element.

9. The laser apparatus as defined in claim 3 wherein the partially reflecting filter further comprises a Fabry Perot etalon disposed between the multifrequency laser diode and the Bragg grating and optically aligned with said laser diode and said Bragg grating for confining the multifrequency laser radiation within the reflection bandwidth b.

10. The laser apparatus as defined in claim 9, wherein the reflection bandwidth of the Bragg grating is greater than a transmission bandwidth of the Fabry-Perot etalon but smaller than an FSR of said etalon.

11. The laser apparatus as defined in claim 9, further comprising collimating means disposed between the multifrequency laser diode and the Fabry-Perot etalon for at least partially collimating the multifrequency laser radiation into an at least partially collimated beam propagating along the optical path, and optical focusing means disposed between the Fabry Perot etalon and the waveguiding optical element for focusing the at least partially collimated beam into the waveguiding optical element.

12. The laser apparatus as defined in claim 1, wherein the partially reflecting filter comprises
   a) collimating means disposed to receive the multifrequency laser radiation for at least partially collimating said radiation into an at least partially collimated multifrequency beam propagating along the optical path,
   b) a bulk transmission grating disposed to receive the at least partially collimated multifrequency beam and to return a portion of the laser beam of the bandwidth b towards the front facet of the multifrequency laser diode, for confining the operation of the semiconductor laser diode to said bandwidth b and for transmitting a second portion of the multifrequency laser radiation along the optical path.

13. The laser apparatus as defined in claim 1, further comprising an anamorphic lens or an anamorphic combination of lenses disposed to receive light from the front facet of the multifrequency laser diode for reshaping the multifrequency laser radiation into a beam having substantially circular symmetry in a plane perpendicular to its optical axes for propagating along the optical path.

14. The laser apparatus as defined in claim 1, wherein the nonlinear element is a periodically-poled crystal.

15. The laser apparatus as defined in claim 14, wherein the nonlinear optical element is a periodically-poled $LiNbO_3$ crystal.

16. The laser apparatus as defined in claim 1, wherein the nonlinear optical element is one of: a nonlinear optical waveguide, a single mode nonlinear optical waveguide, and a periodically-poled nonlinear optical waveguide.

17. The laser apparatus as defined in claim 1, wherein the multifrequency laser diode is a high-power laser diode for emitting light in a range of wavelengths between 350 nm and 1600 nm.

18. The laser apparatus as defined in claim 17, wherein the nonlinear optical element is a frequency-doubling optical element for producing light output in a range of wavelengths between 175 nm and 800 nm.

19. The laser apparatus as defined in claim 1, wherein the multifrequency laser diode is a high-power laser diode for emitting light in a 980 nm wavelength range.

20. The laser apparatus as defined in claim 19, wherein the nonlinear optical element is a frequency-doubling optical element for producing blue light in a 490 nm wavelength range.

* * * * *